United States Patent
Lin et al.

[19]

[11] Patent Number: 6,063,670
[45] Date of Patent: May 16, 2000

[54] GATE FABRICATION PROCESSES FOR SPLIT-GATE TRANSISTORS

[75] Inventors: Bo-Yang Lin, Richardson; Douglas T. Grider, McKinney; George Misium, Plano, all of Tex.

[73] Assignee: Texas Instruments Incorporated, Dallas, Tex.

[21] Appl. No.: 09/060,919

[22] Filed: Apr. 15, 1998

Related U.S. Application Data

[60] Provisional application No. 60/045,113, Apr. 30, 1997.

[51] Int. Cl.$^7$ ................................................ H01L 21/8234
[52] U.S. Cl. .......................... 438/275; 736/911; 257/406
[58] Field of Search ..................... 438/264, 217, 438/766, 297, 275, 736, 911; 257/382, 406, FOR 490; 430/5, 276.1

[56] References Cited

U.S. PATENT DOCUMENTS

| | | | |
|---|---|---|---|
| 3,830,686 | 8/1974 | Lehrer ........................................... | 430/5 |
| 4,651,406 | 3/1987 | Shimizu et al. ........................ | 438/275 |
| 4,920,076 | 4/1990 | Holland et al. ........................ | 438/766 |
| 5,202,284 | 4/1993 | Kamins et al. ............................. | 117/95 |
| 5,268,324 | 12/1993 | Aitken et al. ........................... | 438/217 |
| 5,571,744 | 11/1996 | Demirlioglu ............................. | 438/217 |
| 5,918,116 | 6/1999 | Chittipeddi .............................. | 438/199 |

FOREIGN PATENT DOCUMENTS

| | | | |
|---|---|---|---|
| 54-3470 | 1/1979 | Japan ......................................... | 21/30 |

*Primary Examiner*—Wael Fahmy
*Assistant Examiner*—William David Coleman
*Attorney, Agent, or Firm*—Jacqueline J. Garner; Wade James Brady, III; Frederick J. Telecky, Jr.

[57] ABSTRACT

A method for forming an integrated circuit having multiple gate oxide thicknesses is disclosed herein. The circuit (10) is processed up to gate oxide formation. A first gate dielectric (20) is formed. Next, a disposable layer (22) is formed over the first gate dielectric (20). The disposable layer (22) comprises a material that may be removed selectively with respect to silicon and the gate dielectric, such as germanium. If desired, a second dielectric layer (24) may be formed over the disposable layer (22). A pattern (26) is then formed exposing areas (14) of the circuit where a thinner gate dielectric is desired. The second dielectric layer (24), if it is present, and the disposable layer (22) are removed from the exposed areas. The pattern (26) is then removed. Following pre-gate cleaning, the second gate dielectric (30) is formed. The remaining portions of the disposable layer (22) may be removed either prior to, during, or after the second gate dielectric formation (30).

18 Claims, 2 Drawing Sheets

6,063,670

GATE FABRICATION PROCESSES FOR SPLIT-GATE TRANSISTORS

This application claims priority under 35 USC § 119 (e)(1) of provisional application number 60/045,113, filed Apr. 30, 1997.

FIELD OF THE INVENTION

This invention generally relates to semiconductor processing and more specifically to forming multiple gate oxide thicknesses on a wafer.

BACKGROUND OF THE INVENTION

Presently, there is a great demand for shrinking semiconductor devices to provide an increased density of devices on the semiconductor chip that are faster and consume less power. The scaling of devices in the lateral dimension requires vertical scaling as well so as to achieve adequate device performance. This vertical scaling requires the thickness of the gate dielectric to be reduced so as to provide the required device performance.

On the other hand, there are several instances on a semiconductor chip where thicker gate dielectrics are still desired. For example, if the operating voltage is decreased, the device may no longer be compatible with most of the existing packaged integrated circuits which operate at a standard voltage. For, instance, most circuits using CMOS transistors with gate lengths of 0.5 microns or more operate at 3.3 V. When the gate length is decreased to 0.35 microns, the gate oxide thickness is reduced as well and the operating voltage is lowered to 2.5 V or lower in order to maintain reliability of the gate oxide. Thus, a device may be needed that has input/output peripheral sections that operate at 3.3 V so that the device may be used in systems using other chips operating at 3.3 V while allowing other internal portions of the device to operate at 2.5 V for improved performance. Other situations desiring dual gate dielectric thicknesses include: DRAMs in which a different gate dielectric thickness is desired for the high performance periphery versus the low leakage/low off-current array transistors; and embedded DRAMs which desire different thicknesses for transistors of the logic portion than for the DRAM transistors.

One prior art method for obtaining dual gate oxide thicknesses is called "split-gate". In one "split gate" process, an initial oxide is grown followed by photolithographically masking areas where thick oxides are desired, then etching the grown oxide in areas where the thin oxide is required. The photoresist is then removed via a clean-up process that may include ashing and a final oxidation is performed to grow the thin oxide and slightly thicken the oxide already grown in the thick oxide areas. One of the primary drawbacks of this approach is a higher defect density (resulting in low yield) for the thin gate oxide due to exposure to resist and exposure of the resist removal chemicals to the silicon surface.

Another prior method for forming dual gate oxide thicknesses uses a thin silicon nitride layer to protect the first gate oxide during the patterning and pattern removal for forming the second gate oxide. The thin silicon nitride layer may be removed either before or after the second gate oxide formation. However, the silicon nitride removal has a high probability of damaging neighboring material which can lead to the degradation of device performance and reliability. If the silicon nitride is removed prior to second gate oxide formation, the silicon substrate may be damaged and if the silicon nitride is removed after the second gate oxide formation, the second gate oxide may be damaged.

SUMMARY OF THE INVENTION

A method for forming an integrated circuit having multiple gate oxide thicknesses is disclosed herein. The circuit is processed up to gate dielectric formation in standard manner. A first gate dielectric is formed. Next, a disposable layer is formed over the first gate dielectric. The disposable layer comprises a material that may be removed selectively with respect to silicon and the gate dielectric, such as germanium. If desired, the disposable dielectric layer may comprise more than one layer. A pattern is then formed exposing areas of the circuit where a thinner gate dielectric is desired. The disposable layer is then removed from the exposed areas. The pattern is then removed. Following pre-gate cleaning, the second gate dielectric is formed. The remaining portions of the disposable layer may be removed either prior to or after the second gate dielectric formation.

An advantage of the invention is forming multiple gate dielectric thicknesses without exposing the gate dielectrics to photoresist or photoresist removal processes.

A further advantage of the invention is providing a process for forming a gate oxide of multiple thickness that does not severely degrade the reliability of the transistor.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with a method for forming an IC having a logic core and peripheral circuitry for which a dual thickness gate dielectric layer is desired. It will be apparent to those of ordinary skill in the art that the benefits of the invention may be applied to other devices for which an oxide layer of multiple thicknesses is desired.

Figure 1:
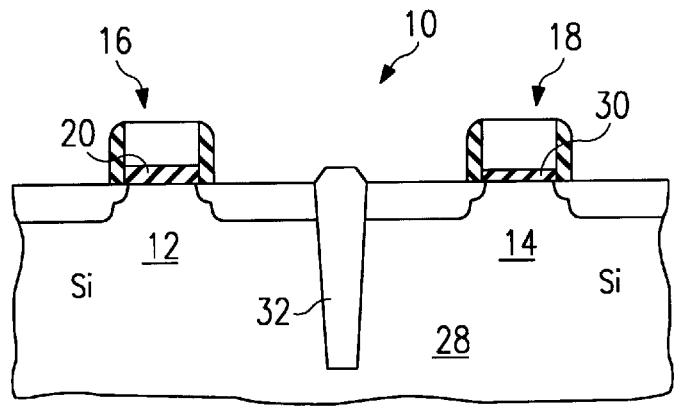
FIG. 1 is a cross-section diagram of a portion of an integrated circuit (IC) having multiple gate dielectric thicknesses according to the invention.

FIG. 1 is a cross-section of a portion of IC 10. IC 10 includes a peripheral circuitry area 12 and a logic core 14. Peripheral circuitry area 12 may include, for example, input/output buffers and other circuitry for communicating with external devices. Logic core 14 contains the high performance circuitry for which a higher packing density and reduced power is desired. It is desired that transistors in area 12, such as transistor 16, operate at a higher operating or supply voltage (for compatibility with external devices) than transistors, such as transistor 18, in the logic core 14. Accordingly, transistors 16, in the peripheral circuitry area 12 have a thicker gate oxide than transistors 18 in the logic core 14.

Figure 2:
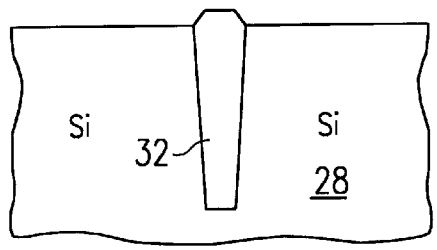
FIGS. 2–10 are cross-sectional diagram of the IC of FIG. 1 at various stages of fabrication.

A method for forming IC 10 will now be discussed with reference to FIGS. 2–10. The structure is processed using standard processing up to gate oxide formation as shown in FIG. 2. For example, isolation structures 32, such as LOCOS isolation or shallow trench isolation, are formed in a semiconductor body 30 to isolate subsequently formed transistors from each other. Standard pre-gate implants have also been performed, such as Vt adjust, punch-through, channel stop, and well implants (not shown).

Figure 3:
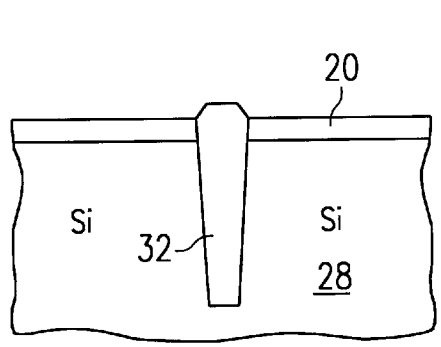

Referring to FIG. 3, the first gate dielectric layer 20 is formed over the surface of IC 10. For example, a layer of silicon-dioxide may be thermally grown. Preferably, first gate dielectric layer 20 is the thicker of the desired gate dielectric thicknesses. The actual thickness will depend on the desired transistor size and performance level. At this point in the process, first gate dielectric layer 20 may be thinner than actually desired. The subsequent formation of the second gate dielectric layer 30, may be used to increase the thickness of first gate dielectric layer 20.

Figure 4:
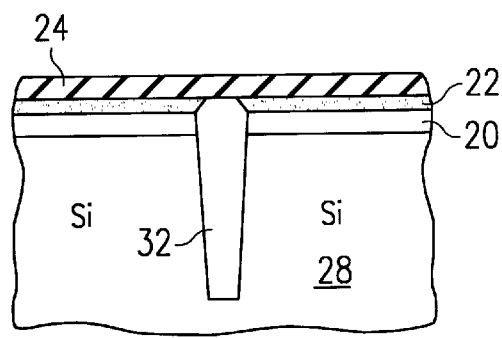

Referring to FIG. 4, a disposable layer 22 is formed over first gate dielectric layer 20. Disposable layer 22 comprises a material that can protect first gate dielectric layer 20 from subsequent photoresist patterning and photoresist removal and that can also be removed selectively with respect to silicon and first gate dielectric layer 20 without unacceptably damaging either layer. In the preferred embodiment, the disposable layer 22 comprises germanium. Alternative materials such as silicon-germanium (SiGe) may also be used. As an example, the thickness of disposable layer 22 may be in the range of 50–5000 Å.

If desired, an optional layer 24 may be formed over disposable layer 22.

Layer 24 may, for example, comprise silicon dioxide or silicon nitride. A typical thickness for optional layer 24 may be on the order of 50–1000 Å.

Figure 5:
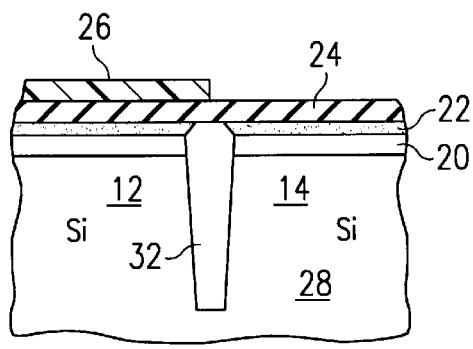

Referring to FIG. 5, a pattern 26 is formed on optional layer 24 or disposable layer 22. Pattern 26 may comprise a resist material. First gate dielectric layer 20 is protected from resist pattern 26 by disposable layer 22. Pattern 26 covers peripheral area 12 where the thicker gate dielectric is desired and exposes logic core area 14 where the higher performance transistors are desired.

Figure 6:
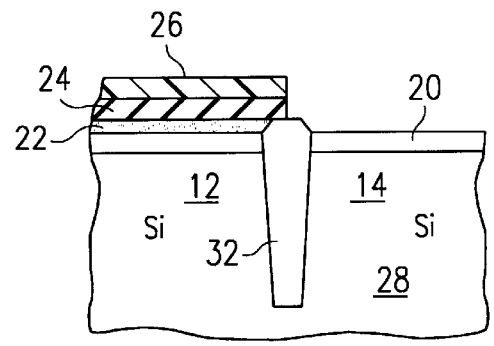
Figure 7:
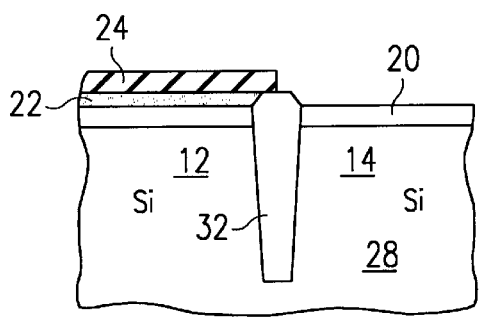

Using pattern 26, the exposed portions of optional layer 24, if present, and disposable layer 22 are removed, as shown in FIG. 6. With disposable layer 22 protecting first gate dielectric layer 20 over the peripheral area 12 and first gate dielectric layer 20 protecting the silicon substrate in logic core area 14, resist pattern 26 is removed without degrading either the portion of first gate dielectric layer 20 in the peripheral area or the silicon substrate (and subsequent channel region) in the logic core area 14. This result is shown in FIG. 7. Damage to the portion of first gate dielectric layer 20 in the logic core area 14 is acceptable as this portion of first gate dielectric layer 20 will be removed and replaced with second gate dielectric layer 30. As an example, a nanostrip process may be used to remove resist pattern 26.

Alternatively, pattern 26 may be used to remove portions of layer 24 only. The pattern 26 may then be removed. Layer 24 may then be used as a hardmask to remove portions of disposable layer 22. Using this method, the entire first gate dielectric layer 20 is protected from the resist strip process.

Figure 8:
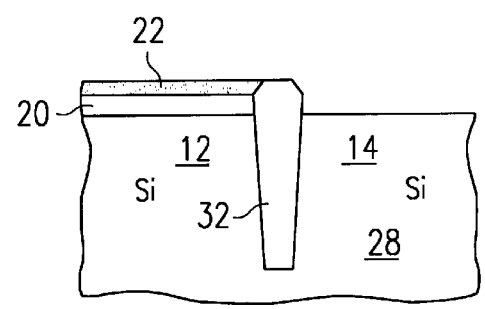

Referring to FIG. 8, the exposed portions of first gate dielectric layer 20 over logic core area 14 are removed. The remaining portions of optional dielectric layer 24 are also removed. The removal of first gate dielectric layer 20 from silicon in logic core 14 may be accomplished without unduly degrading device performance as processes for removing silicon dioxide from silicon with minimal damage to the silicon are well known in the art (e.g., HF).

Figure 9:
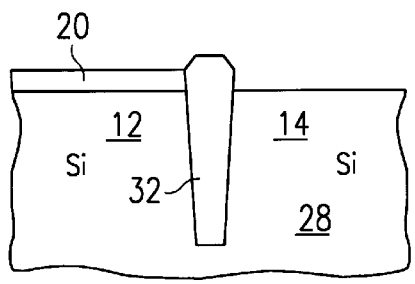
Figure 10:
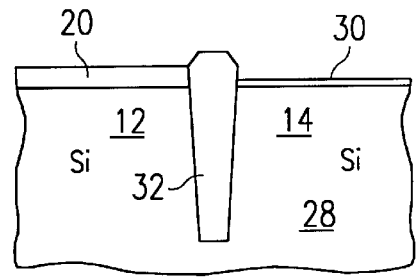

Next, disposable layer 22 may be removed as shown in FIG. 9 and standard pre-gate cleaning steps may be performed. For example, if disposable layer 22 comprises germanium, a $NH_4OH:H_2O_2$ solution may be used to remove disposable layer 22 without degrading device performance. Other exemplary solutions will be apparent to those of ordinary skill in the art. Then, a second gate dielectric layer 30 is formed over logic core 14. If, for example, second dielectric layer 30 comprises a thermally grown silicon dioxide, the process for forming second gate dielectric layer 30 may result in increasing the thickness of first gate dielectric layer 20. If desired, however, disposable layer 22 (with or without layer 24) may instead be removed after the formation of second gate dielectric 30 or during the SiO2 growth.

If the germanium remains in place during the second gate oxidation, it can prevent or minimize the first gate oxide layer from growing thicker (Ge will oxidize, but $GeO_2$ is water soluable). In this case, the first gate oxide may instead be the thinner gate oxide with the second gate oxide being the thicker gate oxide.

Processing then continues in the desired manner. For example, conventional techniques may then be used to form polysilicon gate electrodes, source/drain regions, and various interconnections between transistors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the above process may be varied to form more than two different gate oxide thicknesses. It is therefore intended that the appended claims encompass any such modifications or embodiments.

What is claimed is:

1. A method for fabricating an integrated circuit having multiple gate dielectric thicknesses, comprising the steps of:

forming a first gate dielectric layer over a semiconductor body;

forming a first disposable layer over said first gate dielectric layer, said first disposable layer comprising a material selectively etchable with respect to said first gate dielectric layer and said semiconductor body;

forming a pattern over said first disposable layer, said pattern covering a first region of said disposable layer and exposing a second region of said disposable layer;

removing at least a portion of said first disposable layer in said second region using said pattern;

removing said pattern while said substrate is not exposed;

removing at least a portion of said first gate dielectric layer in said second region; and subsequent to removing said pattern, forming a second gate dielectric layer in said second region, said second gate dielectric layer having a thickness different from said first dielectric layer.

2. The method of claim 1, wherein said pattern is a resist pattern.

3. The method of claim 1, wherein said step of forming said first gate dielectric layer comprises the step of thermally growing a layer of silicon dioxide.

4. The method of claim 1, further comprising the steps of:

forming a second disposable layer over said first disposable layer prior to said step of forming a pattern; and removing a portion of said second disposable layer in said second region using said pattern prior to said step of removing a portion of said first disposable layer.

5. The method of claim 4, wherein said second disposable layer comprises silicon dioxide.

6. The method of claim 1, wherein said first disposable layer comprises germanium.

7. The method of claim 1, further comprising the step of removing said first disposable layer from said first region after removing said pattern and prior to forming said second gate dielectric layer, wherein said removing step removes said portion of said first disposable layer selectively with respect to said first gate dielectric layer and said semiconductor body without significantly damaging said first gate dielectric layer or said semiconductor body.

8. The method of claim 1, further comprising the step of removing said first disposable layer from said first region after said step of forming said second gate dielectric layer, wherein said removing step removes said portion of said first disposable layer selectively with respect to said first and second gate dielectric layers without significantly damaging said first or second gate dielectric layers.

9. The method of claim 1, wherein said step of forming said second gate dielectric layer comprises the step of thermally growing a layer of silicon dioxide.

10. The method of claim 1, further comprising the steps of:

forming high performance transistors in said second region; and forming peripheral circuitry in said first region.

11. A method for fabricating an integrated circuit having dual gate oxide thicknesses, comprising the steps of:

forming a first gate oxide layer over a semiconductor body;

forming a first disposable layer over said first gate oxide layer, said first disposable layer comprising a material selectively etchable with respect to said first gate oxide layer and said semiconductor body;

forming a resist pattern over said first disposable layer, said resist pattern not covering a first gate oxide area and covering a second gate oxide area;

removing at least a portion of said first disposable layer in said first gate oxide area;

removing said resist while said substrate is not exposed;

removing a portion of said first gate oxide layer in said first gate oxide area; and subsequent to removing said resist, forming a second gate oxide layer in said first gate oxide area.

12. The method of claim 11, further comprising the steps of:

forming a second disposable layer over said first disposable layer prior to said step of forming a resist pattern; and removing a portion of said second disposable layer in said thin gate oxide area using said resist pattern prior to said step of removing a portion of said first disposable layer.

13. The method of claim 12, wherein said second disposable layer comprises silicon dioxide.

14. The method of claim 11, wherein said first disposable layer comprises germanium.

15. The method of claim 11, further comprising the step of removing said first disposable layer from said second gate oxide area after removing said pattern and prior to forming said second gate oxide layer, wherein said removing step removes said portion of said first disposable layer selectively with respect to said first gate oxide layer and said semiconductor body without significantly damaging said first gate oxide layer or said semiconductor body.

16. The method of claim 11, further comprising the step of removing said first disposable layer from said second gate oxide area after said step of forming said second gate oxide layer, wherein said removing step removes said portion of said first disposable layer selectively with respect to said first and second gate oxide layers without significantly damaging said first or second gate oxide layers.

17. The method of claim 11, further comprising the steps of:

forming high performance transistors in said first gate oxide area; and forming peripheral circuitry in said second gate oxide area.

18. The method of claim 11, wherein the first disposable layer is removed during said step of forming the second gate oxide layer.

* * * * *